United States Patent [19]

Schucht

[11] 4,322,689
[45] Mar. 30, 1982

[54] HIGH FREQUENCY PULSE AMPLIFIER

[75] Inventor: Peter Schucht, Munich, Fed. Rep. of Germany

[73] Assignee: Siemens Aktiengesellschaft, Berlin & Munich, Fed. Rep. of Germany

[21] Appl. No.: 113,173

[22] Filed: Jan. 18, 1980

[30] Foreign Application Priority Data

Feb. 2, 1979 [DE] Fed. Rep. of Germany ....... 2904011

[51] Int. Cl.³ .......................... H03F 3/19; H03G 3/30
[52] U.S. Cl. .................................... 330/285; 330/286; 330/295; 330/296; 375/71; 375/98; 455/127
[58] Field of Search ............... 330/133, 134, 279, 285, 330/286, 295, 296; 375/60, 68, 71, 98; 455/116, 126, 127

[56] References Cited

U.S. PATENT DOCUMENTS 4,107,630 8/1978 Schucht ........................... 375/71 X

OTHER PUBLICATIONS

Meinke, *Einführung in Die Elektrotechnik Höherer Frequenzen*, 1961 Springer-Verlag, Berlin/Gottingen/Heidelberg, pp. 110-122.

Honold, *Sekundaer-Radar*, Siemens Aktiengesellschaft, 1971, p. 53.

Primary Examiner—James B. Mullins
Attorney, Agent, or Firm—Hill, Van Santen, Steadman, Chiara & Simpson

[57] ABSTRACT

A high frequency amplifier comprises an amplifier stage connected in a grounded base configuration, or a plurality of such amplifier stages connected in tandem, for amplifying high frequency pulses. In order to produce high frequency pulses wherein the output power has a required pulse shape, at the emitter side of each amplifier stage a constant current source is connected which is controlled by a pulse generator which is operable to provide a current having a pulse shape which corresponds to the pulse shape which is the same as the input high frequency pulses.

15 Claims, 2 Drawing Figures

HIGH FREQUENCY PULSE AMPLIFIER

BACKGROUND OF THE INVENTION

1. Field of the Invention

The present invention relates to a high frequency amplifier, comprising a power transistor amplifier stage in a grounded base configuration, or several such amplifier stages connected in a chain, for the amplification, to a high output power, of high frequency pulses which are each input on the emitter side of the power amplifier stage by way of an input matching network and which, having been amplified, are output at the collector side by way of an output matching network, and which are to possess a given waveform envelope.

2. Description of the Prior Art

Various disadvantages occur in known high frequency pulse amplifiers and amplifier chains of the type generally set forth above. As a result of the operational curve of power transistors in class C operation, the pulse shape of the output power comprises relatively flat leading edges and steep trailing edges, so that often it is impossible to adhere to the pulse shape conditions prescribed on the basis of the purpose of use. The more stages are interconnected to form an amplifier chain, the steeper is the gradient of the trailing edge, and the flatter is the drop of the leading edge. This disadvantage is particularly serious because, because of class C operation, only a relatively small degree of amplification can be achieved for each amplifier stage, and thus, when a higher degree of amplification is part and parcel of the system design, it is essential to use a plurality of stages. Furthermore, the operating point, is dependent not only on the operating d.c. voltage, but also on the high frequency drive power. The regulation of the output power in known high frequency pulse power amplifiers of this type by varying the operating voltage also raises problems because of the resultant oscillations which destroy the transistor and because of the inevitable changes in pulse shape. Therefore, large changes in the output power can only be made by disconnecting or connecting parallel amplifier stages, which nevertheless require the additional expense of adder networks, e.g. hybrids.

SUMMARY OF THE INVENTION

The object of the present invention is to provide structure whereby, in a single stage or multi-stage transistor high frequency pulse power amplifier of the type generally mentioned above, a desired shape of the high frequency output power pulses can be achieved.

This object is achieved, according to the present invention, in that, on the emitter side, each of the amplifier stages is additionally connected to a constant current source which is controlled by a pulse generator and which impresses a current corresponding to the pulse curve upon the collector-emitter path of the power transistor for the duration of each pulse emitted from the pulse generator. Also, the pulse curve emitted from the pulse generator is fundamentally identical to the envelope of the high frequency pulse which is to be amplified. This measure produces a class A amplifier which is keyed by way of the constant current source, i.e. during each pulse emanating from the constant current source the individual transistor amplifier stages are engaged in class A operation and even under high frequency overload attract a constant current. The pulse shape of the output power of the amplified high frequency pulses is identical to the shape of the pulses emanating from the constant current source, so that the edges of the amplifier output power can easily be set by adjusting the edges of the pulses of the constant current source. Even when a plurality of amplifier stages of identical construction are connected in a chain, each having a constant current source, the pulse shape of the output power of the overall amplifier chain still corresponds to the control pulse, and the control pulse can be centrally input into all of the constant current sources.

An advantageous further development of the invention is that the current strength emitted from the constant current source is adjustable, and that when a plurality of amplifier stages connected in a chain are used, the current magnitude of all constant current sources each assigned to an amplifier stage are adjustable. This measure permits the output part to be adjusted in a wide range, e.g. 10 dB, while the envelope shape of the high frequency output power pulses remains constant. Even when several high frequency power amplifier stages of identical construction are connected in a chain, the shape of the high frequency output power pulses is maintained, provided all the constant current sources are centrally operated.

The operating point of the high frequency transistor in each amplifier stage designed in accordance with the present invention having a control constant current source is determined only by the current impressed from the assigned constant current source, and by the operating d.c. voltage, and therefore is not dependent upon the high frequency pulses which are to be amplified.

Because of the class A operation during keying, the invention permits a considerable increase in the amplification of a high frequency amplifier stage, so that in the case of an amplifier chain in many cases it is possible to economize on one or more stages.

If a change is made in the setting of the current magnitude, produced by the constant current source, from pulse-to-pulse, individual pulses can be emitted with a higher power for example in the form of a pulse telegram. This is of significance for example in secondary radar equipment, and in particular as regards the emission of side lobe suppression (SLS) pulses which must possess different levels in an artificial resolution improvement process (see Honold, "Sekundär-Radar", 1971, p. 53).

An advantageous further development of the invention is that the adjustable current strength of the constant current source, or in the event that an amplifier chain is used, the adjustable current magnitudes of the constant current sources, be adjusted by means of automatic gain control (AGC) regulation in such a manner that a constant output power occurs at the output of the amplifier stage or at the overall output of the chain-connected amplifier stages.

Another advantageous further development of the invention in a high frequency amplifier comprising a capacitor which supplies the pulse current for a transmitter which emits pulse telegrams, is that from the capacitor there is withdrawn a regulating signal which is characteristic of the amplitude drop during the course of a pulse telegram and by means of which the current magnitudes of the constant current sources are adjusted by AGC regulation in such a manner that all of the pulses of the pulse telegram possess equal amplitudes. Another variation along these lines is that the drop in amplitude in the course of a pulse telegram is compensated by a complementary composition of the pulse telegram emitted from the pulse generator.

Reference must also be made to the possibility of connecting the transistor of an amplifier stage in parallel with a further transistor or a plurality of transistors in respect of a.c. voltage, in which case the emitter of each of these transistors is connected to a separate constant current source, which constant current sources are controlled by the same pulse generator. This dispenses with the necessity for elaborate input and output adder networks, e.g. hybrids. Furthermore, the constant current sources also allow the operating points of the parallel-connected transistors to be decoupled.

An advantageous application of the invention is in secondary radar transmitters for interrogation and response devices.

BRIEF DESCRIPTION OF THE DRAWING

Other objects, features and advantages of the invention, its organization, construction and operation will be best understood from the following detailed description, taken in conjunction with the accompanying drawing, on which.

DESCRIPTION OF THE PREFERRED EMBODIMENTS

Figure 1:
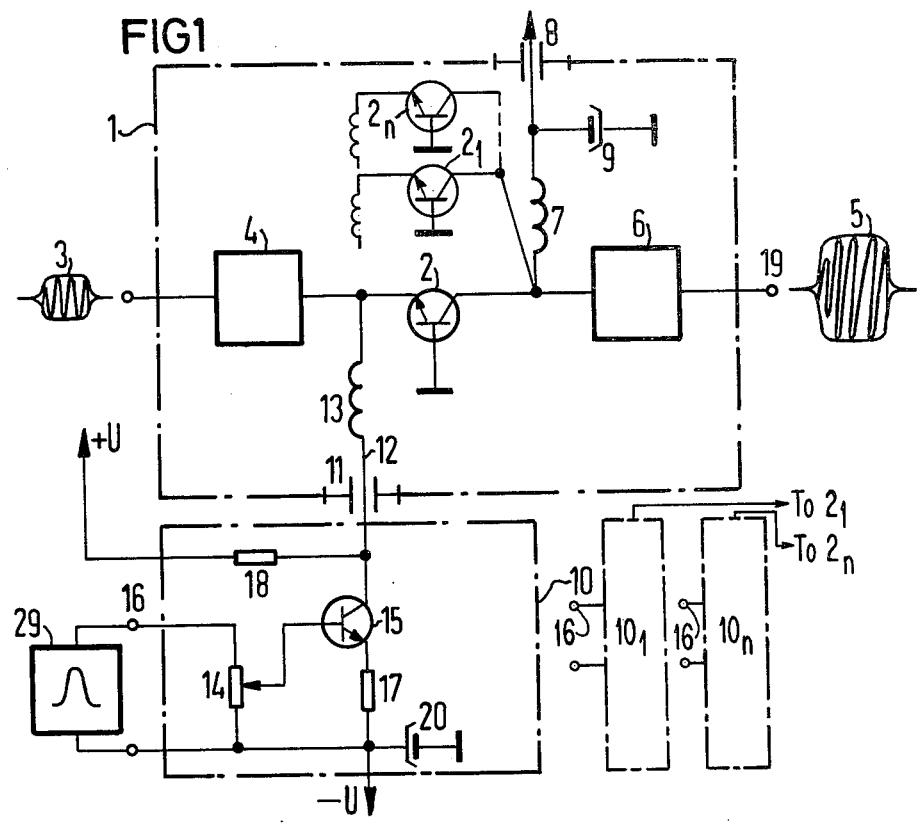
FIG. 1 is a schematic circuit diagram of an individual amplifier stage having a constant current source and constructed in accordance with the present invention.

FIG. 1 illustrates a circuit of a transistor power amplifier stage 1 for high frequency pulses with a high output power in a secondary radar transmitter. A high frequency power transistor 2 is operated in a grounded base configuration. The high frequency pulses 3 which are to be amplified are fed by way of an input matching network 4 to the emitter side of the transistor 2. The amplified high frequency pulses 5 are output by way of an output matching network 6 at an output 19. The operating d.c. voltage for the transistor 2 is supplied by way of an high frequency choke 7 and a feed-through capacitor 8. A capacitor 9, which is designed as an electrolytic capacitor, which is resistant to switching transients, supplys the pulse flow required for the transmitter. The input matching network 4 comprises reactive impedances and transforms the standardized line resistance at the input of the amplifier (pulses 3) to the complex load impedance of the transistor 2. The output matching network 6, likewise comprising reactive impedances, transforms the desired complex load impedance of the transistor 2 to the standardized line impedance at the output 19 of the amplifier. Transformation circuits which are effective in a broad band manner are known, for example, from the book of H. H. Meinke, "Einfüehrung in die Elektrotechnik höeherer Frequenzen", 1961, Springer Publishing House, Berlin/Goettingen/Heidelberg, pp. 110-122.

The amplifier stage 1 is controlled in respect of current by a control circuit 10 by way of the emitter of the transistor 2 by means of a control line 12 which extends through a feed-through capacitor 11. A high frequency choke 13 is also connected in the control line 12. The control circuit 10 comprises a constant current source which is keyed by a pulse generator 29, as a result of which the transistor 2 of the amplifier stage 1 is protected inter alia from thermo-overload and its operating point is maintained stable. The constant current source 10 is supplied from the pulse generator 29 with a pulse input voltage in which the pulses possess a constant "roof" at a voltage divider 14 which is connected to a control input 16 and whose tap is connected to the base of a transistor 15. Therefore, when the control circuit is keyed at the input 16, the transistor 15 which is connected with its emitter to a resistor 17 and with its collector to a resistor 18 is also activated. A constant current flow in the collector of the transistor 15, which is fundamentally independent of the collector voltage across the transistor 2 and thus likewise independent of the power output coupled from the output 19, is maintained by means of the emitter resistor 17 of the transistor 15 when its base is operated in constant fashion. A capacitor in the control circuit 10 is referenced 20, and the operating voltage of the transistor 15 is referenced U. The voltage divider 14 can serve to adjust the constant current required in the control line 12.

While a control pulse is present at the input 16, the constant current source 10 on the emitter side of the high frequency power transistor 2 impresses a constant current onto the latter, and the edges of these pulses can be shaped as required. The high frequency transistor is driven by high frequency pulses 3 of the required pulse shape. If the pulse emitted from the control circuit 10 (constant current source) via the control line 12, and the envelope of the high frequency pulse 3 are identical in shape, the pulse shape of the output power at the output 19 of the amplifier stage 1 is likewise identical.

During the pulse operation by way of the constant current source 10, the amplifier stage 1 operates in class A operation and even under high-frequency overload continuously draws a constant current. In general terms, the pulse shape of the output power of the amplifier stage 1 follows the pulse, incoming by way of the control line 12, from the constant current source 10, so that in this manner the edges of the high frequency output power pulses can be easily adjusted.

By making an adjustment in the voltage divider 14, the pulse voltage supplied to the base of the transistor 15, and thus also the magnitude of the constant current emitted from the control circuit 10 are modified. This measure permits a modification of the output power of the amplifier stage 1 while the pulse shape of this output power remains uniform within a wide range. The voltage divider ratio of the divider 14 can also be adjusted in the case of an AGC regulation in dependence upon a quantity which is to be compensated, so that a constant output power is continuously withdrawn from the amplifier stage 1.

With additional parallel connected transistors $2_1$-$2_n$ and respective constant current sources $10_1$-$10_n$ elaborate input and output networks, e.g. hybrids, can be omitted, as set forth above.

Figure 2:
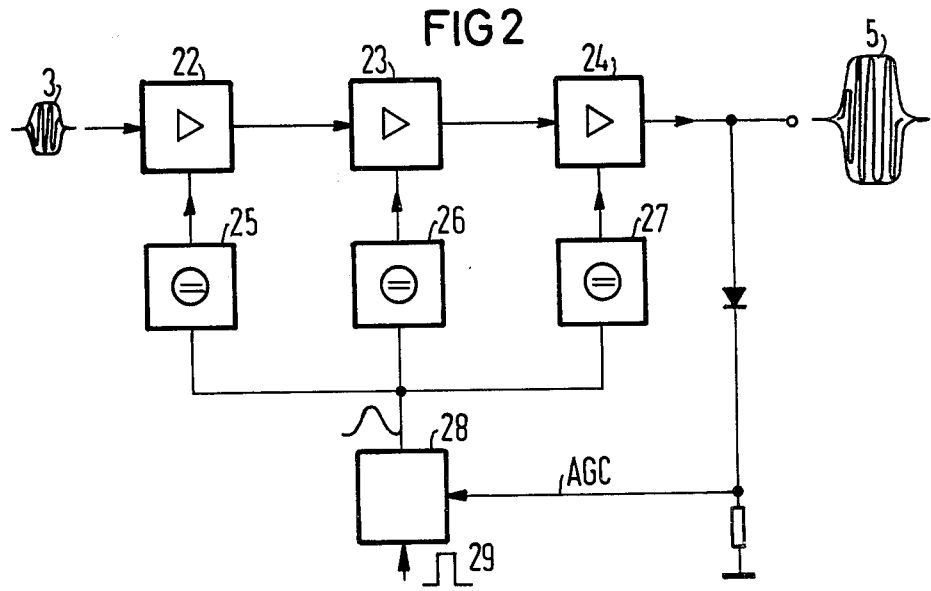
FIG. 2 is a block circuit diagram of an amplifier chain corresponding to the present invention which is regulated to a constant output power.

FIG. 2 is a block circuit diagram of a three-stage amplifier chain regulated to a constant output power by means of an AGC regulating loop. Each of the three a.c.-coupled transistor amplifier stages 22, 23 and 24, each of which corresponds to the amplifier stage 1 of FIG. 1, is assigned a constant current source 25, 26, 27, respectively, each of which corresponds to the control circuit 10 in FIG. 1. The control pulses 29 for all three constant current sources 25, 26, 27 are fed across a common pulse shape or circuit 28 where they are adjusted in respect of their voltage amplitude, and in fact by an AGC regulating voltage which is obtained in dependence upon the total actual output power of the three amplifier stages 22, 23 and 24, in comparison to a reference output power which is to be maintained constant. The edges of the pulses which are emitted from the pulse shaper circuit and which control the constant current sources 25, 26 and 27 align the edges of the high frequency pulses 3 which pass through the amplifier stages 22, 23 and 24. Here, the shape of the pulses which centrally control the constant current sources 25, 26 and 27 is advantageously designed to be identical to the envelope of the high frequency pulses 3 present at the input of the first amplifier stage 25. The high frequency pulses which are present at the output of the three-stage amplifier chain are referenced 5.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. A high frequency power amplifier comprising:
a power amplifier stage including a transistor having a grounded base, a collector and an emitter, an input matching network including an input for receiving high frequency pulses to be amplified and an output connected to said emitter, and an output matching network including an input connected to said collector and an output for emitting an amplified high frequency pulse; and
constant current means including a constant current source connected to said emitter for providing a constant current pulse to the collector-emitter path of said transistor corresponding to the envelope of the input high frequency pulses, and a pulse generator connected to said constant current source and operable to activate said constant current source with pulses having a shape corresponding to the envelope of the high frequency input pulses.

2. The amplifier of claim 1, wherein said constant current means comprises:
adjusting means for adjusting the current magnitude of said constant current source.

3. A high frequency power amplifier comprising:
a power amplifier including an input for receiving high frequency pulses, a transistor having a grounded base, an emitter connected to said input and a collector, and a capacitor connected to said collector and adapted to feed amplified high frequency pulses to a pulse telegram transmitter and developing a control signal indicating the amplitude drop during a pulse telegram;
a constant current source connected to said emitter and including a pulse input for receiving an activating pulse having a pulse shape substantially the same as that of the envelope of the high frequency input pulses and a gain control input; and
an automatic gain control circuit connected between said capacitor and said constant current source for deriving a gain control signal from the control signal.

4. A high frequency power amplifier comprising:
a plurality of high frequency power transistors each including a grounded base, an emitter and a collector, said transistors connected in parallel in respect of a.c. voltage, said emitters receiving high frequency input pulses for amplification;
a plurality of constant current sources each connected to a respective emitter; and
a pulse generator connected to and operable to activate said constant current sources with pulses which have shapes substantially the same as the envelopes of the high frequency input pulses.

5. A high frequency power amplifier comprising:
a high frequency power transistor including a base connected to a reference potential, an emitter for receiving a high frequency input pulse, and a collector for emitting amplified high frequency pulses;
a constant current source connected to said emitter; and
a pulse generator connected to activate said constant current source with a pulse having a shape substantially the same as the envelope of the high frequency input pulse.

6. The amplifier of claim 5, in combination with a secondary radar transmitter of an interrogation and response device.

7. The amplifier of claim 5, wherein said constant current source comprises:
means for adjusting the magnitude of the constant current.

8. The amplifier of claim 5, wherein said constant current source comprises:
a transistor including a base and a collector-emitter path connected between an operating voltage and said emitter of said power transistor; and
a potentiometer connected to receive pulses from said pulse generator, said potentiometer including an adjustable tap connected to said base for controlling the magnitude of current through said collector-emitter path.

9. A high frequency power amplifier comprising:
a power amplifier stage including a transistor having a grounded base, a collector and an emitter, an input matching network including an input for receiving high frequency pulses to be amplified and an output connected to said emitter, and an output matching network including an input connected to said collector and an output for emitting an amplified high frequency pulse; and
constant current means including a constant current source connected to said emitter for providing a constant current pulse to the collector-emitter path of said transistor corresponding to the envelope of the input high frequency pulses, a pulse generator connected to said constant current source and operable to activate said constant current source with the pulses having a shape corresponding to the envelope of the high frequency input pulses, and adjustment means for adjusting the current magnitude of said constant current source including an automatic gain control circuit connected to said output of said output matching network.

10. A high frequency power amplifier comprising:
a plurality of power amplifier stages connected in a chain and each including a transistor having a grounded base, a collector and an emitter, an input matching network including an input for receiving high frequency pulses to be amplified and an output connected to said emitter, and an output matching network including an input connected to said collector and an output for emitting an amplified high frequency pulse; and constant current means including a plurality of constant current sources each connected to a respective emitter of a respective power amplifier stage for providing a constant current pulse to the collector-emitter path of the respective transistor corresponding to the envelope of the input high frequency pulses, and a pulse generator connected in common to said constant current sources and operable to activate said constant current sources with pulses having a shape corresponding to the envelope of the high frequency input pulses.

11. The amplifier of claim 10, wherein said constant current means comprises:

an automatic gain control circuit connected to the output of the last amplifier stage of said chain for deriving a gain control signal for each of the stages.

12. The amplifier of claim 10, comprising:

adjusting means connected to said plurality of constant current means for common adjustment of the constant current magnitudes.

13. The amplifier of claim 12, wherein said adjusting means includes means for adjusting current magnitude from pulse-to-pulse.

14. A high frequency power amplifier comprising:

a power amplifier including an input for receiving high frequency pulses, a transistor having a grounded base, an emitter coupled to said input and a collector, and a capacitor connected to said collector and adapted to feed amplified high frequency pulses to a pulse telegram transmitter and developing a control signal indicating the amplitude drop during a pulse telegram; and a constant current source connected to said emitter and including a pulse input for receiving an activating pulse having a pulse shape substantially the same as that of the envelope of the high frequency input pulses.

15. A high frequency power amplifier according to claim 14, wherein:

said power amplifier further comprises an impedance matching network coupling said input to said emitter on said transistor.

* * * * *